US012592276B2

(12) United States Patent
Tu et al.

(10) Patent No.: US 12,592,276 B2
(45) Date of Patent: Mar. 31, 2026

(54) SEMICONDUCTOR MEMORY DEVICE WITH SENSE AMPLIFIER THAT OPERATES FOR TWO DIFFERENT VOLTAGE RANGE AND WRITING METHOD THEREOF

(71) Applicant: Winbond Electronics Corp., Taichung City (TW)

(72) Inventors: Ying-Te Tu, New Taipei City (TW); Hsi-Yuan Wang, Hsinchu City (TW)

(73) Assignee: Winbond Electronics Corp., Taichung City (TW)

( * ) Notice: Subject to any disclaimer, the term of this patent is extended or adjusted under 35 U.S.C. 154(b) by 133 days.

(21) Appl. No.: 18/408,608

(22) Filed: Jan. 10, 2024

(65) Prior Publication Data

US 2024/0347103 A1    Oct. 17, 2024

(51) Int. Cl.
*G11C 11/4096*        (2006.01)
*G11C 11/4091*        (2006.01)
*G11C 11/4094*        (2006.01)

(52) U.S. Cl.
CPC ...... *G11C 11/4096* (2013.01); *G11C 11/4091* (2013.01); *G11C 11/4094* (2013.01)

(58) Field of Classification Search
CPC ............ G11C 11/4096; G11C 11/4091; G11C 11/4094; G11C 11/419; G11C 16/06; G11C 16/24; G11C 7/06
See application file for complete search history.

(56) References Cited

U.S. PATENT DOCUMENTS

| | | | |
|---|---|---|---|
| 5,646,898 A | 7/1997 | Manning | |
| 7,656,721 B2 | 2/2010 | Wang et al. | |
| 7,729,184 B2 | 6/2010 | Im et al. | |
| 10,840,974 B1* | 11/2020 | Ware | H04B 1/04 |
| 11,587,599 B2* | 2/2023 | Kurosawa | G11C 16/26 |
| 2005/0104627 A1 | 5/2005 | Song et al. | |
| 2020/0075110 A1* | 3/2020 | Suzuki | G11C 16/30 |

FOREIGN PATENT DOCUMENTS

| | | | | |
|---|---|---|---|---|
| CN | 105304122 A | * | 2/2016 | ............. G11C 7/08 |
| CN | 112581989 | | 3/2021 | |
| EP | 4075436 | | 10/2022 | |
| TW | 1331341 | | 10/2010 | |
| TW | 1434285 | | 4/2014 | |
| TW | 201935300 | | 9/2019 | |
| TW | 202042220 | | 11/2020 | |
| TW | 202101450 | | 1/2021 | |

OTHER PUBLICATIONS

"Office Action of Taiwan Counterpart Application", issued on Mar. 22, 2024, p. 1-p. 6.

* cited by examiner

*Primary Examiner* — Sultana Begum
(74) *Attorney, Agent, or Firm* — JCIPRNET

(57)        ABSTRACT

A semiconductor memory device and a writing method thereof. The semiconductor memory device includes a memory control circuit and a memory array. The memory array includes a target memory bank. The target memory bank includes a target memory cell and a sense amplifier circuit. The sense amplifier circuit is coupled to the target memory cell via a bit line, receives a data signal within a first voltage value range from the memory control circuit, and generates a bit line signal within a second voltage value range on the bit line according to the data signal. The second voltage value range is greater than the first voltage value range.

8 Claims, 3 Drawing Sheets

Receiving a data signal within a first voltage value range — S302

Generating a bit line signal within a second voltage value range on a bit line coupled to a target memory cell according to the data signal, and the second voltage value range being greater than the first voltage value range — S304

SEMICONDUCTOR MEMORY DEVICE WITH SENSE AMPLIFIER THAT OPERATES FOR TWO DIFFERENT VOLTAGE RANGE AND WRITING METHOD THEREOF

CROSS-REFERENCE TO RELATED APPLICATION

This application claims the priority benefit of Taiwan application serial no. 112114044, filed on Apr. 14, 2023. The entirety of the above-mentioned patent application is hereby incorporated by reference herein and made a part of this specification.

BACKGROUND

Technical Field

The disclosure relates to a data writing method, and more particularly to a semiconductor memory device and a writing method used thereof.

Description of Related Art

When dynamic random access memory (DRAM) is connected to and communicates with a system on a chip (SoC) that serves as a memory controller, if the SoC has already reached a 3 nanometers (nm)/5 nm manufacturing process, the voltage value (I/O voltage) of a data signal that the SoC provides may have already been reduced to 0.6 volts or below. At this time, facing the situation that the connection voltage of the DRAM end is still maintained at 1.2 volts, a common practice is to convert the received data signal from 0.6 volts adapted for the SoC to 1.2 volts adapted for the DRAM through the physical layer of the DRAM, or to use another method by implementing voltage conversion through a level shifter disposed within the DRAM itself.

As the chip stacking process of a three dimensional integrated circuit stack (3D-IC stack) becomes more mature, the SoC and DRAM are gradually moving towards the design of wide input/output (Wide I/O). The number of input/output ports to which the SoC and DRAM are connected may always start at a hundred, and even thousands of input/output ports for connection are required in pursuit of bandwidth. In this situation, the method of adding a level shifter to each input/output port to implement voltage conversion not only occupies space but also increases manufacturing costs. Moreover, the configuration of level shifters also affects the read and write speed, preventing an increase in bandwidth.

SUMMARY

The disclosure provides a semiconductor memory device and a writing method thereof, which may smoothly connect dynamic random access memory with a system on a chip without the assistance of a level shifter.

The semiconductor memory device of the disclosure includes a memory control circuit and a memory array. The memory array is coupled to the memory control circuit. The memory array includes a target memory bank. The target memory bank includes a target memory cell and a sense amplifier circuit. The target memory cell is coupled to a bit line. The sense amplifier circuit is coupled to the target memory cell via the bit line, receives a data signal within a first voltage value range from the memory control circuit, and generates a bit line signal within a second voltage value range on the bit line according to the data signal. The second voltage value range is greater than the first voltage value range.

The writing method of the semiconductor memory device of the disclosure includes the following steps: a data signal within a first voltage value range is received; and a bit line signal within a second voltage value range is generated on a bit line coupled to a target memory cell according to the data signal, and the second voltage value range is greater than the first voltage value range.

Based on the above, the semiconductor memory device and the writing method thereof of the disclosure can convert the data signal received from the memory control circuit into a bit line signal with a larger voltage range without the configuration of a level shifter, which not only reduces the occupied space and manufacturing costs, but also facilitates the increase in bandwidth.

In order to make the aforementioned features and advantages of the disclosure comprehensible, embodiments accompanied with drawings are described in detail as follows.

DESCRIPTION OF THE EMBODIMENTS

Figure 1:
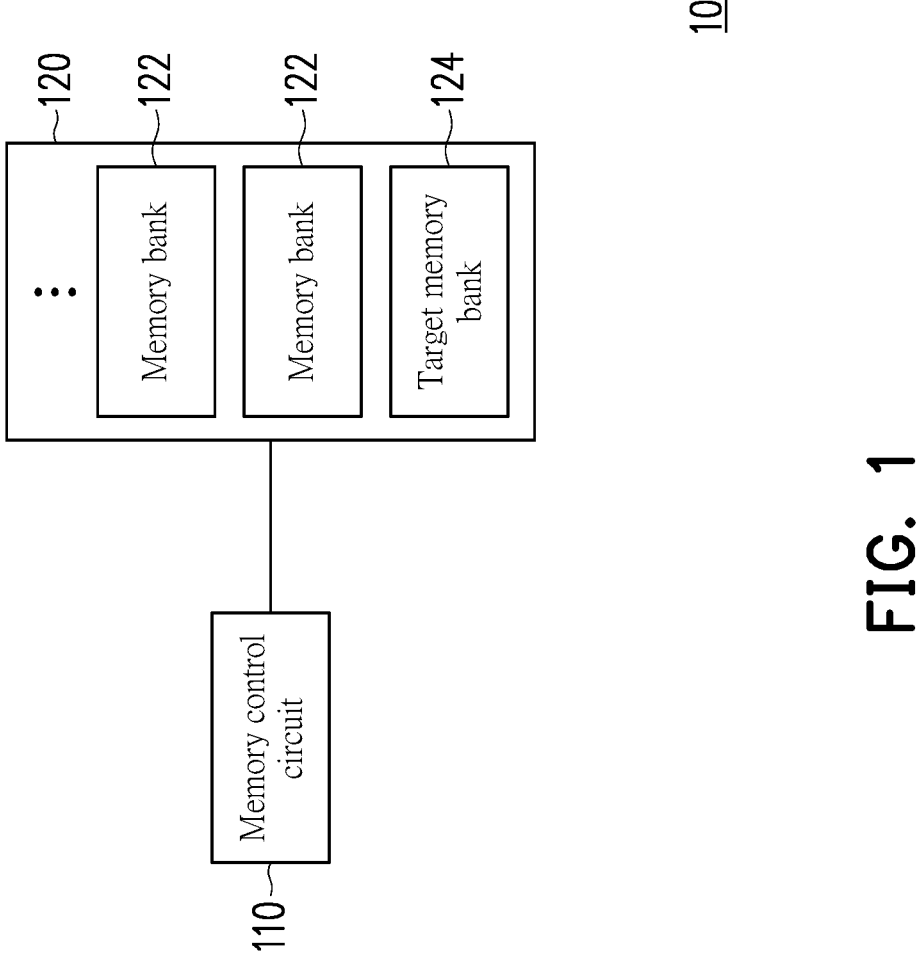
FIG. 1 is a block diagram of a semiconductor memory device according to an embodiment of the disclosure.
Figure 2:
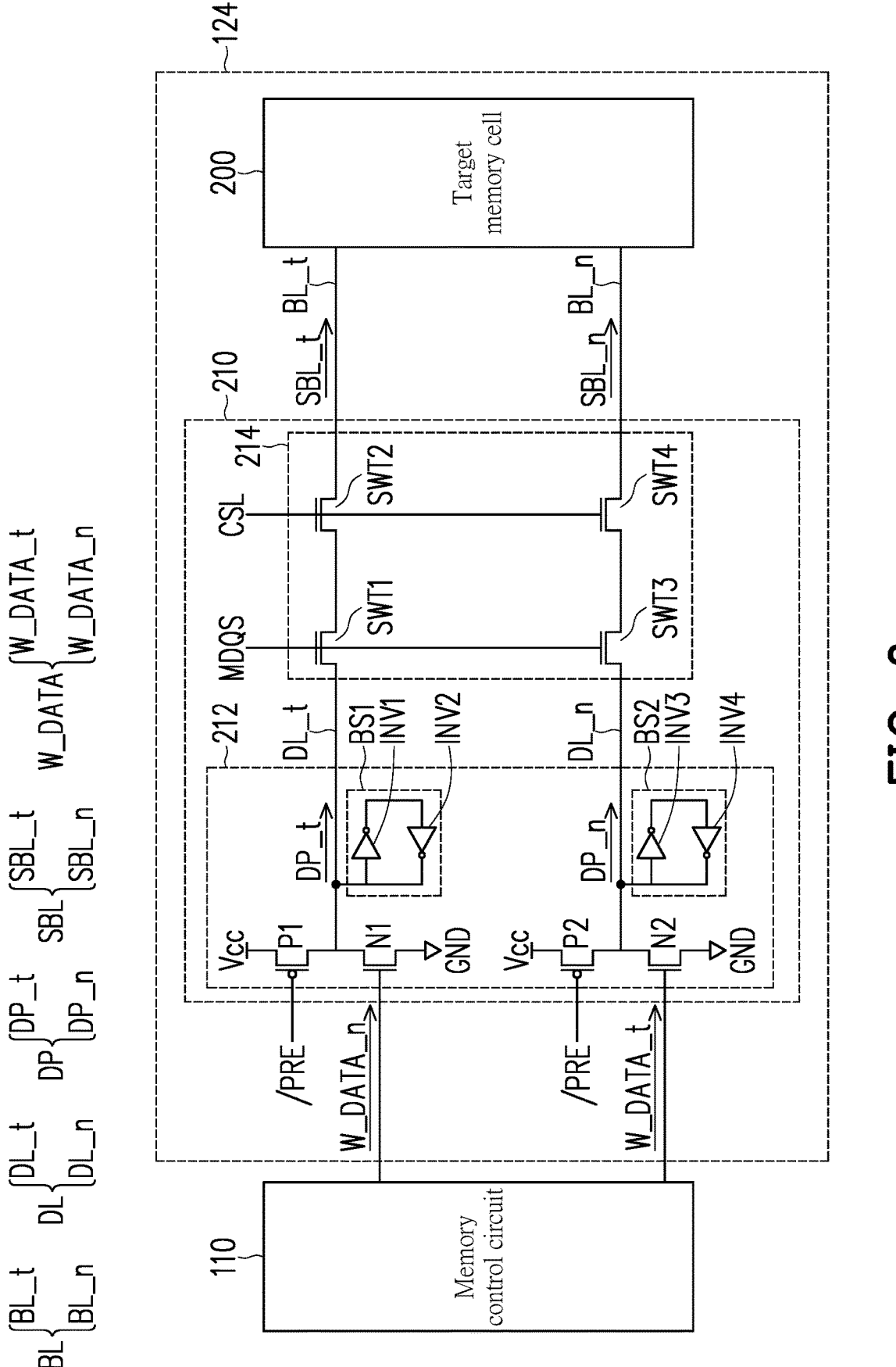
FIG. 2 is a circuit diagram of the target memory bank according to the embodiment of FIG. 1.

Please refer to FIGS. 1 and 2 at the same time. A semiconductor memory device 100 includes a memory control circuit 110 and a memory array 120. The memory array 120 is, for example, a dynamic random access memory (DRAM) array, which is coupled to the memory control circuit 110. The memory array 120 includes multiple memory banks 122. The memory control circuit 110 may select a target memory bank 124 from the memory banks 122 according to a received selection command to perform a specified operation (operations such as writing or reading). To simplify the illustration, merely two memory banks 122 and one target memory bank 124 are shown in FIG. 1 as representatives, but the disclosure is not limited thereto.

The memory control circuit 110, in addition to being, for example, a central processing unit (CPU) or other programmable general-purpose or special-purpose microprocessors, a digital signal processor (DSP), a programmable controller, an application specific integrated circuit (ASIC), a programmable logic device (PLD), or other similar devices or combinations thereof, may also be a hardware circuit designed through hardware description language (HDL) or any other digital circuit design methods known to those of ordinary skill in the art, and implemented through methods such as a field programmable gate array (FPGA) or a complex programmable logic device (CPLD).

In FIG. 2, the target memory bank 124 includes a target memory cell 200 and a sense amplifier circuit 210. The target memory cell 200 is a memory cell selected from multiple memory cells in the target memory bank 124 by the selection command received by the memory control circuit 110 to perform the specified operation. The target memory cell 200 is coupled to a bit line BL. In the embodiment, due to the use of differential sensing, the bit line BL coupled to the target memory cell 200 includes a first bit line BL_t and a second bit line BL_n.

The sense amplifier circuit 210 is coupled to the target memory cell 200 via the first bit line BL_t and the second bit line BL_n. The sense amplifier circuit 210 may receive a data signal W_DATA within a first voltage value range from the memory control circuit 110 and generate a bit line signal SBL within a second voltage value range on the first bit line BL_t and the second bit line BL_n according to the data signal W_DATA. In the embodiment, the bit line signal SBL includes a bit line signal SBL_t generated on the first bit line BL_t and a bit line signal SBL_n generated on the second bit line BL_n. In addition, the second voltage value range is greater than the first voltage value range, for example, the first voltage value range is 0 volts to 0.6 volts, and the second voltage value range is 0 volts to 1.2 volts, but the disclosure is not limited thereto.

In more detail, the sense amplifier circuit 210 includes an amplifier circuit 212 and a selection circuit 214. The amplifier circuit 212 operates under a power voltage Vcc (e.g., 1.2 volts) within the second voltage value range and may be configured to, during a write operation to the target memory cell 200, pull up data potential DP on a data line DL coupled to the bit line BL in response to a precharge signal/PRE, and then pull down the data potential DP in response to the data signal W_DATA, thereby changing the voltage value of the bit line signal SBL on the bit line BL.

In addition, the selection circuit 214 is coupled between the data line DL and the bit line BL. The selection circuit 214 may be configured to determine whether to turn on the transmission path between the data line DL and the bit line BL according to a data selection signal MDQS and a row selection signal CSL. When the target memory cell 200 is selected to perform the specified operation, the data selection signal MDQS and the row selection signal CSL turn on the transmission path between the data line DL and the bit line BL.

In the composition of the circuit, the amplifier circuit 212 includes a first P-type field-effect transistor P1, a first N-type field-effect transistor N1, a first bus holder BS1, a second P-type field-effect transistor P2, a second N-type field-effect transistor N2, and a second bus holder BS2. In the embodiment, due to the use of differential sensing, the data signal W_DATA includes a positive data signal W_DATA_t and a negative data signal W_DATA_n, the data line DL includes a first data line DL_t and a second data line DL_n, and the data potential DP includes data potential DP_t on the first data line DL_t and data potential DP_n on the second data line DL_n. The source of the first P-type field-effect transistor P1 is coupled to the power voltage Vcc, and the gate of the first P-type field-effect transistor P1 receives the precharge signal/PRE. The drain of the first N-type field-effect transistor N1 is coupled to the drain of the first P-type field-effect transistor P1 and the first data line DL_t, the gate of the first N-type field-effect transistor N1 receives the negative data signal W_DATA_n, and the source of the first N-type field-effect transistor N1 is coupled to ground potential GND. The first bus holder BS1 is coupled to the first data line DL_t. The source of the second P-type field-effect transistor P2 is coupled to the power voltage Vcc, and the gate of the second P-type field-effect transistor P2 receives the precharge signal/PRE. The drain of the second N-type field-effect transistor N2 is coupled to the drain of the second P-type field-effect transistor P2 and the second data line DL_n, the gate of the second N-type field-effect transistor N2 receives the positive data signal W_DATA_t, and the source of the second N-type field-effect transistor N2 is coupled to the ground potential GND. The second bus holder BS2 is coupled to the second data line DL_n.

The first bus holder BS1 includes a first inverter INV1 and a second inverter INV2. The second bus holder BS2 includes a third inverter INV3 and a fourth inverter INV4. The input end of the first inverter INV1 is coupled to the first data line DL_t, the input end of the second inverter INV2 is coupled to the output end of the first inverter INV1, and the output end of the second inverter INV2 is coupled to the input end of the first inverter INV1. The input end of the third inverter INV3 is coupled to the second data line DL_n, the input end of the fourth inverter INV4 is coupled to the output end of the third inverter INV3, and the output end of the fourth inverter INV4 is coupled to the input end of the third inverter INV3.

The selection circuit 214 includes a first switch transistor SWT1, a second switch transistor SWT2, a third switch transistor SWT3, and a fourth switch transistor SWT4. The first end of the first switch transistor SWT1 is coupled to the first data line DL_t, and the control end of the first switch transistor SWT1 receives the data selection signal MDQS. The first end of the second switch transistor SWT2 is coupled to the second end of the first switch transistor SWT1, the second end of the second switch transistor SWT2 is coupled to the first bit line BL_t, and the control end of the second switch transistor SWT2 receives the row selection signal CSL. The first end of the third switch transistor SWT3 is coupled to the second data line DL_n, and the control end of the third switch transistor SWT3 receives the data selection signal MDQS. The first end of the fourth switch transistor SWT4 is coupled to the second end of the third switch transistor SWT3, the second end of the fourth switch transistor SWT4 is coupled to the second bit line BL_n, and the control end of the fourth switch transistor receives the row selection signal CSL.

Based on the composition of the above circuit, during the write operation to the target memory cell 200, first, the data selection signal MDQS turns on the first switch transistor SWT1 and the third switch transistor SWT3, and the row selection signal CSL turns on the second switch transistor SWT2 and the fourth switch transistor SWT4, thereby turning on the transmission path between the first data line DL_t and the first bit line BL_t, as well as the transmission path between the second data line DL_n and the second bit line BL_n. In the case where the transmission paths are turned on, the bit line signal SBL_t is equivalent to the data potential DP_t, and the bit line signal SBL_n is equivalent to the data potential DP_n.

Moreover, the precharge signal/PRE inside the target memory bank 124 is converted to a low logic level (e.g., 0 volts) so that the first P-type field-effect transistor P1 and the second P-type field-effect transistor P2 are turned on, and the data potential DP_t on the first data line DL_t and the data potential DP_n on the second data line DL_n are pulled up (e.g., pulled up to 1.2 volts) through the power voltage Vcc within the second voltage value range. In this case, the pull-up data potential DP_t is the same as the data potential DP_n, and is within the second voltage value range. At the same time, both the bit line signal SBL_t and the bit line signal SBL_n are at a high logic level.

After the data potential DP_t and the data potential DP_n are pulled up, the precharge signal/PRE is converted to a high logic level (e.g., 1.2 volts) so that the first P-type field-effect transistor P1 and the second P-type field-effect transistor P2 are disconnected. At this time, the data potential DP_t on the first data line DL_t and the data potential DP_n on the second data line DL_n may be maintained through the first bus holder BS1 and the second bus holder BS2, respectively.

Next, the memory control circuit 110 transmits the negative data signal W_DATA_n and the positive data signal W_DATA_t to the gate of the first N-type field-effect transistor N1 and the gate of the second N-type field-effect transistor N2, respectively so that one of the first P-type field-effect transistor P1 and the second P-type field-effect transistor P2 is turned on. The positive data signal W_DATA_t and the negative data signal W_DATA_n are within the first voltage value range, and the logic level of the positive data signal W_DATA_t and the logic level of the negative data signal W_DATA_n are complementary. For example, when writing data "0" to the target memory cell 200, the positive data signal W_DATA_t output by the memory control circuit 110 is at a low logic level (e.g., 0 volts), and the negative data signal W_DATA_n is at a high logic level (e.g., 6 volts). In this case, the first N-type field-effect transistor N1 receiving the negative data signal W_DATA_n is turned on, and the data potential DP_t on the first data line DL_t is pulled down (e.g., pulled down to 0 volts). In this way, the voltage value of the bit line signal SBL_t generated on the first bit line BL_t also changes and is pulled down to a low logic level. Thus, the data "0" may be written to the target memory cell 200 according to the difference between the bit line signal SBL_t and the bit line signal SBL_n.

On the other hand, when writing data "1" to the target memory cell 200, the positive data signal W_DATA_t output by the memory control circuit 110 is at a high logic level (e.g., 6 volts), and the negative data signal W_DATA_n is at a low logic level (e.g., 0 volts). In this case, the second N-type field-effect transistor N2 receiving the positive data signal W_DATA_t is turned on, and the data potential DP_n on the second data line DL_n is pulled down (e.g., pulled down to 0 volts). In this way, the voltage value of the bit line signal SBL_n generated on the first bit line BL_n also changes and is pulled down to a low logic level. Thus, the data "1" may be written to the target memory cell 200 according to the difference between the bit line signal SBL_t and the bit line signal SBL_n.

Figure 3:
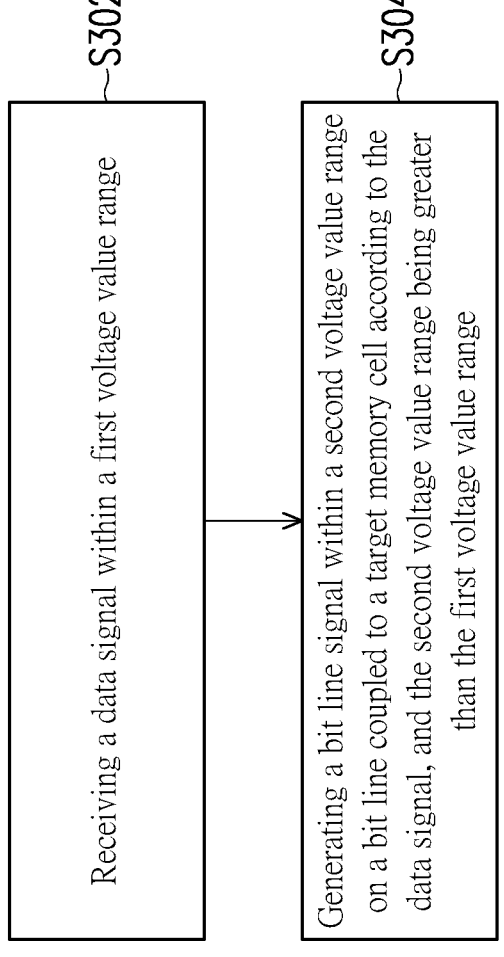
FIG. 3 is a flowchart of the steps of a writing method of a semiconductor memory device according to an embodiment of the disclosure.

Referring to FIG. 3, in the embodiment, a writing method of a semiconductor memory device includes the following steps. A data signal within a first voltage value range is received (step S302). A bit line signal within a second voltage value range is generated on a bit line coupled to a target memory cell according to the data signal, and the second voltage value range is greater than the first voltage value range (step S304). The implementation details of the above steps S302 and S304 may refer to the embodiments of FIGS. 1 to 2, and the descriptions are not repeated here.

In summary, the semiconductor memory device and the writing method thereof of the disclosure may first perform pre-charging and pull two data potential using differential sensing up to a voltage within the second voltage value range (e.g., 1.2 volts), and then according to the data signal within the first voltage value range, pull one of the data potential down to the ground potential (e.g., 0 volts) to determine the correct data state. In this way, the data signal can be converted into a bit line signal with a larger voltage value range without the configuration of a level shifter, which not only reduces the occupied space and manufacturing costs, but also facilitates the increase in bandwidth.

What is claimed is:

1. A semiconductor memory device, comprising:
   a memory control circuit; and a memory array, coupled to the memory control circuit, the memory array comprising a target memory bank, wherein the target memory bank comprises:

a target memory cell, coupled to a bit line; and a sense amplifier circuit, coupled to the target memory cell via the bit line, receiving a data signal within a first voltage value range from the memory control circuit, and generating a bit line signal within a second voltage value range on the bit line according to the data signal, and the second voltage value range being greater than the first voltage value range, wherein the sense amplifier circuit comprises:

an amplifier circuit, operating under a power voltage within the second voltage value range, configured to, during a write operation to the target memory cell, use the power voltage to pull up data potential on a data line coupled to the bit line in response to a precharge signal, and then pull down the data potential in response to the data signal, thereby changing a voltage value of the bit line signal.

2. The semiconductor memory device according to claim 1, wherein the data signal comprises a positive data signal and a negative data signal, the data line comprises a first data line and a second data line, and the amplifier circuit comprises:

a first P-type field-effect transistor, a source of the first P-type field-effect transistor being coupled to the power voltage, and a gate of the first P-type field-effect transistor receiving the precharge signal;

a first N-type field-effect transistor, a drain of the first N-type field-effect transistor being coupled to a drain of the first P-type field-effect transistor and the first data line, a gate of the first N-type field-effect transistor receiving the negative data signal, and a source of the first N-type field-effect transistor being coupled to ground potential;

a first bus holder, coupled to the first data line;

a second P-type field-effect transistor, a source of the second P-type field-effect transistor being coupled to the power voltage, and a gate of the second P-type field-effect transistor receiving the precharge signal;

a second N-type field-effect transistor, a drain of the second N-type field-effect transistor being coupled to a drain of the second P-type field-effect transistor and the second data line, a gate of the second N-type field-effect transistor receiving the positive data signal, and a source the second N-type field-effect transistor being coupled to the ground potential; and a second bus holder, coupled to the second data line.

3. The semiconductor memory device according to claim 2, wherein the first bus holder comprises:

a first inverter, an input end of the first inverter being coupled to the first data line; and a second inverter, an input end of the second inverter being coupled to an output end of the first inverter, an output end of the second inverter being coupled to the input end of the first inverter, the second bus holder comprises:

a third inverter, an input end of the third inverter being coupled to the second data line; and a fourth inverter, an input end of the fourth inverter being coupled to an output end of the third inverter, an output end of the fourth inverter being coupled to the input end of the third inverter.

4. The semiconductor memory device according to claim 1, wherein the sense amplifier circuit further comprises:

a selection circuit, coupled between the data line and the bit line, configured to determine whether to turn on a transmission path between the data line and the bit line according to a data selection signal and a row selection signal.

5. The semiconductor memory device according to claim 4, wherein the data line comprises a first data line and a second data line, the bit line comprises a first bit line and a second bit line, and the selection circuit comprises:

a first switch transistor, a first end of the first switch transistor being coupled to the first data line, and a control end of the first switch transistor receiving the data selection signal;

a second switch transistor, a first end of the second switch transistor being coupled to a second end of the first switch transistor, a second end of the second switch transistor being coupled to the first bit line, and a control end of the second switch transistor receiving the row selection signal;

a third switch transistor, a first end of the third switch transistor being coupled to the second data line, and a control end of the third switch transistor receiving the data selection signal; and a fourth switch transistor, a first end of the fourth switch transistor being coupled to a second end of the third switch transistor, a second end of the fourth switch transistor being coupled to the second bit line, and a control end of the fourth switch transistor receiving the row selection signal.

6. The semiconductor memory device according to claim 1, wherein the first voltage value range is 0 volts to 0.6 volts, and the second voltage value range is 0 volts to 1.2 volts.

7. A writing method of a semiconductor memory device, comprising:

receiving a data signal within a first voltage value range; and generating a bit line signal within a second voltage value range on a bit line coupled to a target memory cell according to the data signal, and the second voltage value range being greater than the first voltage value range, wherein generating the bit line signal within the second voltage value range on the bit line coupled to the target memory cell according to the data signal comprises:

during a write operation to the target memory cell, using a power voltage within the second voltage value range to pull up data potential on a data line coupled to the bit line in response to a precharge signal, and then pulling down the data potential in response to the data signal, thereby changing a voltage value of the bit line signal.

8. The writing method of the semiconductor memory device according to claim 7, wherein the first voltage value range is 0 volts to 0.6 volts, and the second voltage value range is 0 volts to 1.2 volts.

* * * * *